United States Patent
Mosely et al.

(10) Patent No.: US 6,355,560 B1
(45) Date of Patent: Mar. 12, 2002

(54) LOW TEMPERATURE INTEGRATED METALLIZATION PROCESS AND APPARATUS

(75) Inventors: Roderick Craig Mosely, Pleasanton; Hong Zhang, Fremont; Fusen Chen, Cupestino; Ted Guo, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/209,434

(22) Filed: Dec. 10, 1998

Related U.S. Application Data

(62) Division of application No. 08/561,605, filed on Nov. 21, 1995, now Pat. No. 5,877,087.

(51) Int. Cl.[7] .......................................... H01L 21/4763

(52) U.S. Cl. ..................... 438/648; 438/643; 438/688

(58) Field of Search ................... 438/648, 656, 438/683, 688, 653, 654, 643, 644, 680

(56) References Cited

U.S. PATENT DOCUMENTS

| | | | |
|---|---|---|---|
| 4,784,973 A | 11/1988 | Stevens et al. | 437/200 |
| 4,920,072 A | 4/1990 | Keller et al. | 437/192 |
| 4,920,073 A | 4/1990 | Wei et al. | 437/200 |
| 4,926,237 A | 5/1990 | Sun et al. | 357/71 |
| 4,938,996 A | 7/1990 | Ziv et al. | 427/53.1 |
| 4,951,601 A | 8/1990 | Maydan et al. | 118/719 |
| 4,960,732 A | * 10/1990 | Dixit et al. | |
| 4,985,750 A | 1/1991 | Hoshino | 357/71 |
| 4,994,410 A | 2/1991 | Sun et al. | 437/192 |
| 5,010,032 A | 4/1991 | Tang et al. | 437/57 |
| 5,023,201 A | 6/1991 | Stanasolovich et al. | 437/192 |
| 5,028,565 A | 7/1991 | Chang et al. | 437/192 |
| 5,032,233 A | 7/1991 | Yu et al. | 204/192.28 |
| 5,043,299 A | 8/1991 | Chang et al. | 437/192 |
| 5,043,300 A | 8/1991 | Nulman | 437/200 |
| 5,080,933 A | 1/1992 | Grupen-Shemansky et al. | 427/255.1 |

(List continued on next page.)

FOREIGN PATENT DOCUMENTS

| | | |
|---|---|---|
| DE | 374591 A1 | 7/1988 |
| JP | 63-9925 | 6/1986 |
| JP | 63-176031 | 7/1988 |
| JP | 8-10693 | 3/1989 |
| JP | 2-26051 | 1/1990 |
| JP | 25-13900 | 1/1992 |

OTHER PUBLICATIONS

C.–K. Hu, K.L. Lee, D. Gupta, and P. Blauner, "Electromigration and Diffusion in Pure Cu and Cu(Sn) Alloys," Mat. Res. Soc. Symp. Proc. vol. 427© 1996 Materials Research Society, pp. 95–107.

(List continued on next page.)

*Primary Examiner*—Caridad Everhart
(74) *Attorney, Agent, or Firm*—Moser, Patterson & Sheridan, LLP

(57) ABSTRACT

The present invention relates generally to an improved process for providing uniform step coverage on a substrate and planarization of metal layers to form continuous, void-free contacts or vias in sub-half micron applications. In one aspect of the invention, a refractory layer is deposited onto a substrate having high aspect ratio contacts or vias formed thereon. A CVD metal layer is then deposited onto the refractory layer at low temperatures to provide a conformal wetting layer for a PVD metal. Next, a PVD metal is deposited onto the previously formed CVD metal layer at a temperature below that of the melting point temperature of the metal. The resulting CVD/PVD metal layer is substantially void-free. The metallization process is preferably carried out in an integrated processing system that includes both a PVD and CVD processing chamber so that once the substrate is introduced into a vacuum environment, the metallization of the vias and contacts occurs without the formation of an oxide layer over the CVD Al layer.

16 Claims, 6 Drawing Sheets

U.S. PATENT DOCUMENTS

| | | | |
|---|---|---|---|
| 5,081,064 A | | 1/1992 | Inoue et al. ............... 437/190 |
| 5,102,826 A | | 4/1992 | Ohshima et al. ........... 437/200 |
| 5,102,827 A | | 4/1992 | Chen et al. ................. 437/200 |
| 5,106,781 A | | 4/1992 | Penning De Vries ....... 437/192 |
| 5,143,867 A | | 9/1992 | d'Heurle et al. ............ 437/188 |
| 5,147,819 A | | 9/1992 | Yu et al. ..................... 437/173 |
| 5,166,095 A | * | 11/1992 | Hwang |
| 5,240,739 A | | 8/1993 | Doan et al. |
| 5,250,465 A | | 10/1993 | Iizuka et al. ................ 437/173 |
| 5,250,467 A | | 10/1993 | Somekh et al. ............. 437/192 |
| 5,292,558 A | | 3/1994 | Heller et al. ................ 427/533 |
| 5,308,796 A | | 5/1994 | Feldman et al. ............ 437/200 |
| 5,312,774 A | | 5/1994 | Nakamura et al. .......... 437/192 |
| 5,316,972 A | | 5/1994 | Mikoshiba et al. ......... 437/187 |
| 5,354,712 A | | 10/1994 | Ho et al. ..................... 437/195 |
| 5,380,682 A | | 1/1995 | Edwards et al. ............ 437/225 |
| 5,384,284 A | | 1/1995 | Doan et al. ................. 437/190 |
| 5,429,991 A | | 7/1995 | Iwasaki et al. ............. 437/192 |
| 5,439,731 A | | 8/1995 | Li et al. ...................... 428/209 |
| 5,478,780 A | | 12/1995 | Koerner et al. ............. 437/190 |
| 5,480,836 A | | 1/1996 | Harada et al. .............. 437/192 |
| 5,514,425 A | | 5/1996 | Ito et al. ..................... 427/534 |
| 5,585,308 A | | 12/1996 | Sardella ...................... 437/190 |
| 5,585,673 A | | 12/1996 | Joshi et al. .................. 257/751 |
| 5,607,776 A | | 3/1997 | Mueller et al. ............. 428/472 |
| 5,688,718 A | * | 11/1997 | Shue |
| 5,723,382 A | * | 3/1998 | Sandhu et al. .............. 438/653 |
| 5,943,600 A | * | 8/1999 | Ngan et al. |
| 5,976,969 A | * | 11/1999 | Lin et al. |

OTHER PUBLICATIONS

K. Tsukamoto, T. Okamoto, M. Shimizu, T. Matsuykawa, and H. Harada, "Self–Aligned Titanium Silicidation by Lamp Annealing," LSI R&D Lab., Mitsubishi Electric Corp., 1984, pp. 47–50.

K. Sugai, H. Okabayaski, T. Shinzawa, S. Kishida, A. Kobayashi, T. Yako and H. Kadokura, "Aluminum chemical vapor deposition with new gas phase pretreatment using tetrakisdimethylamino–titanium for ultralarge–scale integrated–circuit metallization," Sumitomo Chemical Company Limited, Jun. 16, 1995, pp. 2115–2118.

Tohru Hara, Kouichi Tani, and Ken Inoue, Shigeaki Nakamura and Takeshi Murai, "Formation of titanium nitride layers by the nitridation of titanium in high–pressure ammonium ambient,"© 1990 American Institute of Physics, pp. 1660–1662.

K. Mikagi, H. Ishikawa, T. Usami, M. Suzuki, K. Inoue, N. Oda, S. Chikaki, I. Sakai and T. Kikkawa, "Barrier Metal Free Copper Damascene Interconnection Technology Using Atmospheric Copper Reflow and Nitrogen Doping in SiOF Film," IEDM 96–365, pp. 14.5.1–14.5.4.

Shyam P. Muraka and Steven W. Hymes, "Copper Metallization for ULSI and Beyond," Critical Reviews in Solid State and Materials Sciences, 20(2):87–124 (1995) pp. 87–93 & 119–120.

Yosi Shacham–Diamand, Valery Dubin, Matthew Angyal, "Electroless copper deposition for ULSI," Thin Solid Films 262 (1995), pp. 93–103.

* cited by examiner

LOW TEMPERATURE INTEGRATED METALLIZATION PROCESS AND APPARATUS

This is a divisional of copending application(s) Ser. No. 08/561,605 filed on Nov. 21, 1995 now U.S. Pat. No. 5,877,087.

FIELD OF THE INVENTION

The present invention relates to a metallization process for manufacturing semiconductor devices. More particularly, the present invention relates to the metallization of apertures to form void-free interconnections between conducting layers, including such contacts or vias in high aspect ratio sub-half micron applications.

BACKGROUND OF THE INVENTION

Sub-half micron multilevel metallization is one of the key technologies for the next generation of very large scale integration ("VLSI"). The multilevel interconnections that lie at the heart of this technology require planarization of high aspect ratio apertures, including contacts, vias, lines or other features. Reliable formation of these interconnects is very important to the success of VLSI and to the continued effort to increase circuit density and quality on individual substrates and die.

Aluminum (Al) layers formed by chemical vapor deposition ("CVD"), like other CVD processes, provide good conformal aluminum layers, i.e., a uniform thickness layer on the sides and base of the feature, for very small geometries, including sub-half micron (<0.5 $\mu$m) apertures, at low temperatures. Therefore, CVD of aluminum is acommon method used to fill apertures. However, recent transmission electron microscopy data ("TEM") has revealed that voids exist in many of the CVD formed Al apertures even though electric tests of these same apertures do not evidence the existence of this void. If the layer is subsequently processed, the void can result in a defective circuit.

Referring to FIG. 3, a TEM photograph shows a cross-sectional image of a 0.45 micron via filled with CVD Al. The image clearly indicates that voids exist in the metal layer deposited within the via structure. It should be recognized that this kind of void is very difficult to detect by regular cross sectional standard electron microscopy ("SEM") techniques, because some deformation occurs in soft aluminum during mechanical polishing. In addition, electric conductivity tests do not detect any structural abnormalities. However, despite the generally positive electric conductivity tests, conduction through the contact having the void may, over time, compromise the integrity of the integrated circuit devices.

A TEM study of various CVD Al layers formed on substrates indicates that the formation of voids occurs through a key hole process wherein the top portion of the via becomes sealed before the via has been entirely filled. Although a thin conformal layer of CVD Al can typically be deposited in high aspect ratio contacts and vias at low temperatures, continued CVD deposition to complete filing of the contacts or vias typically results in the formation of voids therein. Extensive efforts have been focused on elimination of voids in metal layers by modifying CVD processing conditions. However, the results have not yielded a void free structure.

An alternative technique for metallization of high aspect ratio apertures, is hot planarization of aluminum through physical vapor deposition ("PVD"). The first step in this process requires deposition of a thin layer of a refractory metal such as titanium (Ti) on a patterned wafer to form a wetting layer which facilitates flow of the Al during the PVD process. Following deposition of the wetting layer, the next step requires deposition of either (1) a hot PVD Al layer or (2) a cold PVD Al layer followed by a hot PVD Al layer onto the wetting layer. However, hot PVD Al processes are very sensitive to the quality of the wetting layer, wafer condition, and other processing parameters. Small variations in processing conditions and/or poor coverage of the PVD Ti wetting layer can result in incomplete filling of the contacts or vias, thus creating voids. In order to reliably fill the vias and contacts, hot PVD Al processes must be performed at temperatures above about 450° C. Because the PVD Ti process provides poor coverage of high aspect ratio, sub-micron via side walls, hot PVD Al does not provide reliable filling of the contacts or vias. Even at higher temperatures, PVD processes may result in a bridging effect whereby the mouth of the contact or via is closed because the deposition layer formed on the top surface of the substrate and the upper walls of the contact or via join before the floor of the contact or via has been completely filled.

Once a PVD Al layer has been deposited onto the substrate, reflow of the Al may occur by directing ion bombardment towards the substrate itself. Bombarding the substrate with ions causes the metal layer formed on the substrate to reflow. This process typical heats the metal layer as a result of the energy created by the plasma and resulting collisions of ions onto the metal layer. The generation of high temperatures of the metal layers formed on the substrate compromises the integrity of devices having sub-half micron geometries. Therefore, heating of the metal layers is disfavored in these applications.

U.S. Pat. No. 5,147,819 ("the '819 patent") discloses a process for filling vias that involves applying a CVD Al layer with a thickness of from 5 percent to 35 percent of the defined contact or via diameter to improve step coverage, then applying a sufficiently thick PVD Al layer to achieve a predetermined overall layer thickness. A high energy laser beam is then used to melt the intermixed CVD Al and PVD Al and thereby achieve improved step coverage and planarization. However, this process requires heating the wafer surface to a temperature no less than 660° C. Such a high temperature is not acceptable for most sub-half micron technology. Furthermore, the use of laser beams scanned over a wafer may affect the reflectivity and uniformity of the metal layer.

The '819 patent also discloses that silicide layers and/or barrier metal layers may be deposited onto a wafer before Al is deposited by either a CVD or PVD process. According to the teachings of this reference, these additional underlying layers are desirable to increase electrical conduction and minimize junction spiking.

U.S. Pat. No. 5,250,465 ("the '465 patent") discloses a process similar to the '819 patent using a high energy laser beam to planarize intermixed CVD/PVD metal structures. Alternatively, the '465 patent teaches the application of a PVD Al layer formed at a wafer temperature of about 550° C. However, during the high temperature sputtering process, ion bombardment due to the plasma raises the surface temperature to about 660° C. causing the Al film to melt and planarize. Like the process of the '819 patent, the use of high temperatures is unacceptable for most sub-half micron applications, and particularly for use in filling high aspect ratio sub-half micron contacts and vias. Subjecting wafers to temperatures high enough to melt intermixed CVD/PVD metal layers can compromise the integrity of devices formed on the substrate, in particular where the process is used to planarize a metal layer formed above several other metal and dielectric layers.

Other attempts at filling high aspect ratio sub-half micron contacts and vias using known reflow or planarization processes at lower temperatures have resulted in dewetting of the CVD Al from the silicon dioxide ($SiO_2$) substrate and the formation of discontinuous islands on the side walls of the vias. Furthermore, in order for the CVD Al to resist dewetting at lower temperatures, the thickness of the CVD Al has to be several thousand Angstroms (Å). Since ten thousand Angstroms equal one micron, a CVD Al layer of several thousand Angstroms on the walls of a sub-half micron via will completely seal the via and form voids.

Therefore, there remains a need for a low temperature metallization process for filling apertures, particularly high aspect ratio sub-half micron contacts and vias. More particularly, it would be desirable to have a low temperature process for filling such contacts and via with only a thin layer of CVD Al and allowing the via to then be filled with PVD Al.

SUMMARY OF THE INVENTION

The present invention provides a process for providing uniform step coverage on a substrate. First, a thin refractory layer is formed on a substrate followed by a thin conformal CVD metal layer formed over the refractory layer. A PVD metal layer is then deposited over the CVD metal layer.

The present invention relates generally to improved step coverage and planarization of metal layers to form continuous, void-free contacts or vias, including such as in sub-half micron applications. In one aspect of the invention, a refractory layer is deposited onto a substrate having high aspect ratio contacts or vias formed thereon. A CVD Al layer is then deposited onto the refractory layer at low temperatures to provide a conformal wetting layer for PVD Al. Next, PVD Al is deposited onto the previously formed CVD Al layer at a temperature below that of the melting point of aluminum. The resulting CVD/PVD Al layer is substantially void-free.

In another aspect of the invention, the metallization process is carried out in an integrated processing system that includes both a PVD and CVD processing chamber. Once the substrate is introduced into a vacuum environment, the metallization of the vias and contacts occurs without the formation of an oxide layer over the CVD Al layer. This results because the substrate need not be transferred from one processing system to another system to undergo deposition of the CVD and PVD deposited layers. Accordingly, the substrate remains under vacuum pressure thereby preventing formation of detrimental oxide layers. Furthermore, diffusion of dopants deposited with the PVD layer into the CVD layer is improved by simultaneous deposition in the integrated system.

The present invention further provides an apparatus for providing improved step coverage and metallization of a semiconductor. The apparatus comprises a multiplicity of isolatable communicating regions including a load lock chamber, a refractory metal processing chamber, a CVD metal processing chamber, and a PVD metal processing chamber. The apparatus further comprises an intermediate substrate transport region and vacuum means communicating with the isolatable regions for establishing a vacuum gradient of decreasing pressure across the apparatus from the load lock chamber to the processing chambers.

BRIEF DESCRIPTION OF THE DRAWINGS

So that the manner in which the above recited features, advantages and objects of the present invention are attained and can be understood in detail, a more particular description of the invention, briefly summarized above, may be had by reference to th embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF A PREFERRED EMBODIMENT

Figure 2:
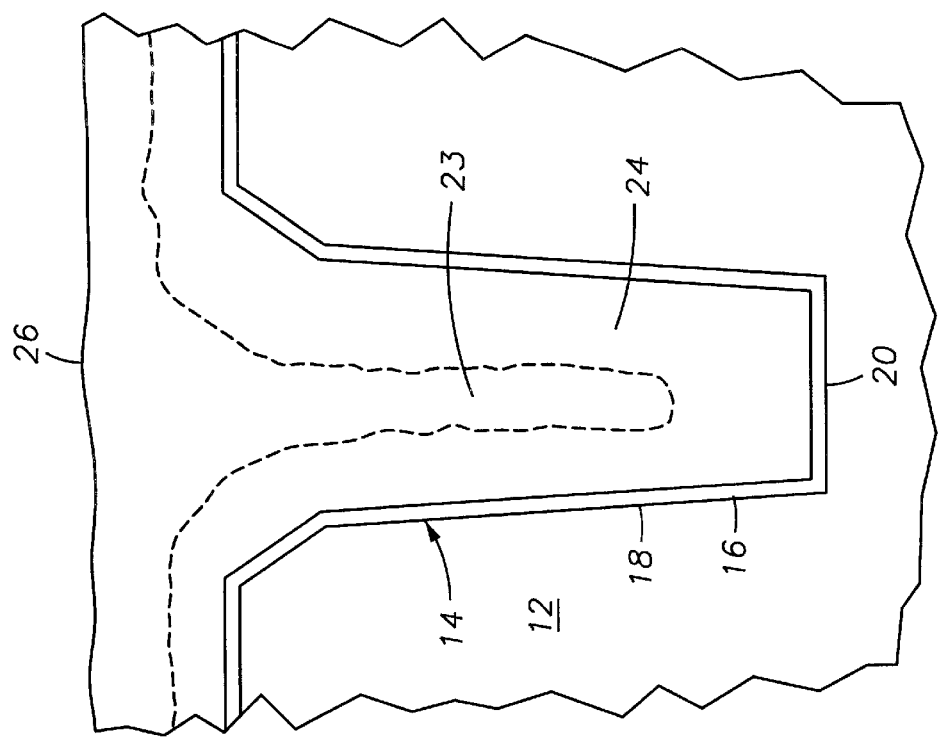
FIG. 2 is a schematic diagram of a metallized semiconductor substrate via according to the present invention having a glue layer and an intermixed CVD/PVD Al layer.

The present invention provides a method for providing improved uniform step coverage in high aspect ratio apertures at low temperature, particularly in sub-micron apertures. One aspect of the invention provides a method for metallizing high aspect ratio apertures, including contacts, vias, lines or other features,with aluminum at temperatures below about 660° C. In particular, the invention provides improved step coverage for filling high aspect ratio apertures in applications with a first layer of CVD aluminum ("CVD Al") and a second layer of PVD aluminum ("PVD Al") where the thin CVD Al layer is prevented from dewetting on a dielectric layer by capping the dielectric layer with a thin glue layer comprised of a refractory metal having a melting point greater than that of aluminum and providing greater wetting with aluminum than does the dielectric. Preferably, this process occurs in an integrated processing system including both a CVD and a PVD processing chamber.

It has been demonstrated that some soft metals, such as aluminum (Al) and copper (Cu), can flow at temperatures below their respective melting points due to the effects of surface tension. However, these metals have a tendency to dewet from an underlying dielectric layer at high temperatures. Therefore, the present invention interposes a glue layer between a soft metal layer and the dielectric to improve the wetting of the soft metal. An appropriate glue layer is one that wets the soft metal better than the dielectric material. It is preferred that the glue layer provide improved wetting even when only a thin layer of glue is deposited. It follows that a preferred glue can be formed substantially uniformly over the surface of the dielectric, including the walls and floor of the apertures.

According to the present invention, preferred glue layers include such layers as a PVD Ti or other refractory (Nb, aluminum silicates, silica, high alumina, etc.), CVD TiN, PVD TiN, or a combination of these layers. The glue layer is deposited to form a substantially continuous cap over the dielectric layer. Titanium, having good wetting properties with aluminum and a melting temperature of about 1675° C., is a preferred glue material and may be deposited by PVD or CVD processes.

A layer of CVD Al is then grown atop the glue layer to form conforming coverage of the via structure without sealing the top of the vias. CVD Al provides a conformal wetting layer over the glue layer for receipt of PVD Al thereon. While the CVD Al may be deposited under various conditions, a standard process involves wafer temperatures of between about 180° C. and about 265° C. and a deposition rate of between about 20 Å/sec and about 130 Å/sec. The CVD Al deposition may be performed at chamber pressures of between about 1 torr and about 80 torr, with the preferred chamber pressures being about 25 torr. The preferred deposition reaction for CVD Al involves the reaction of dimethyl aluminum hydride ("DMAH") with hydrogen gas ($H_2$) according to the following equation:

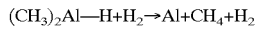

The substrate is then sent to a PVD Al chamber to deposit PVD Al below the melting point temperature of the CVD Al and PVD Al. Where the soft metal is aluminum, it is preferred that the PVD Al be deposited at a wafer temperature below about 660° C., preferably below about 400° C. The aluminum layers start to flow during the PVD deposition process at about 400° C., with the titanium glue layer remaining firmly in place as a solid metal layer. Because titanium has good wetting with aluminum, the CVD Al is prevented from dewetting the titanium at about 400° C. and, therefore, wafer temperatures above the melting point of aluminum (>660° C.), as taught by the prior art CVD process, are not required. Therefore, the application of a thin titanium layer enables planarization of the aluminum to be achieved at temperatures far below the melting point of the aluminum.

It is preferred that the PVD Al layer further comprise copper (Cu) sputtered along with the aluminum in a simultaneous PVD AlCu process. When the PVD AlCu sequentially follows CVD Al, no oxide layer can form therebetween and the PVD ALCu grows epitaxially on the CVD Al such that nograin boundries are present. Furthermore, the sequential CVD Al/PVD Al Cu process allows the intermixed layer to be annealed at about 300° C. for about 15 minutes and acheive uniform distribution of Cu in the stack. It is also preferred that the top surface of the intermixed CVD/PVD Al layer receive a PVD TiN anti-reflection coating ("ARC") for reducing the reflectivity of the surface and improving the photolithographic performance of the layer. Finally, a most preferred method of the present invention for metallization of a substrate aperture includes the sequential steps of precleaning the substrate surface, depositing titanium through a coherent Ti process, CVD Al, PVD AlCu and TiN ARC.

Figure 1:
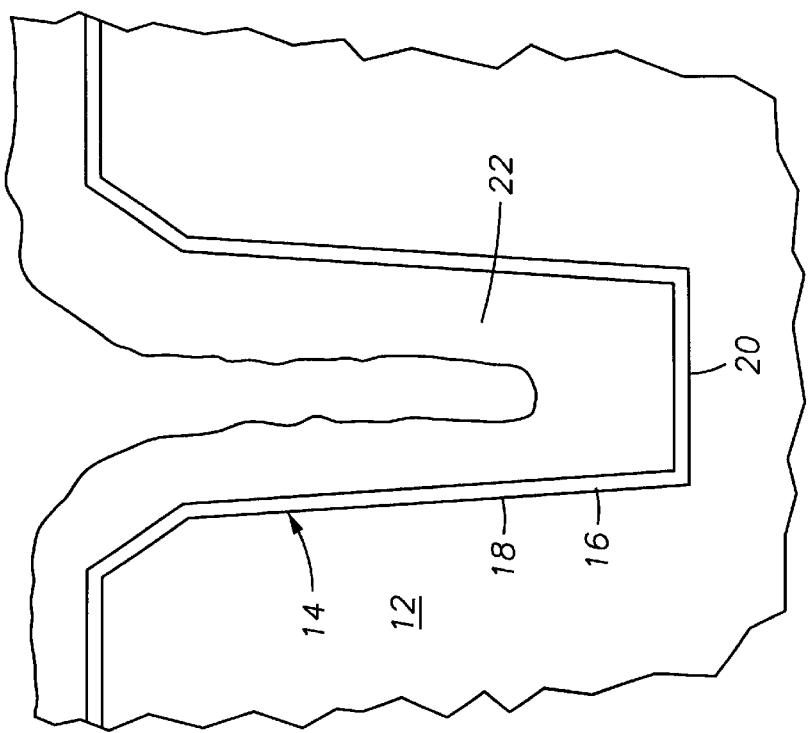
FIG. 1 is a schematic diagram of a metallized semiconductor substrate via according to the present invention having a glue layer and a CVD Al layer.

Referring now to FIG. 1, a schematic diagram of a substrate having a patterned dielectric layer 12 formed thereon is shown. The dielectric layer 12 has a via 14 having a high aspect ratio, i.e, a high ratio of via depth to via diameter, of about three (3), but the present invention may be beneficial in cooperation with vias having any aspect ratio. A thin titanium layer 16 is deposited directly onto the substrate covering substantially all surfaces of the dielectric layer 12 including the walls 18 and floor 20 of via 14. The thin titanium layer 16 will generally have a thickness of between about 5 Å and about 700 Å, with the preferred thickness being in the range between about 100 Å and about 200 Å. A conformal CVD Al layer 22 is deposited on the titanium layer 16 to a desired thickness not to exceed the thickness which would seal the top of the contact or via.

Referring now to FIG. 2, a PVD Al layer is deposited onto the CVD Al layer 22 (layer 22 of FIG. 1) to form a PVD Al layer 23 thereon. An intermixed CVD/PVD Al layer will result from intermixing as the PVD Al is deposited onto the CVD Al layer. The PVD Al may contain certain dopants and upon deposition the PVD Al may intermix with the CVD Al so that the dopant is dispersed throughout much of the PVD/CVD Al intermixed layer 24. However, the PVD Al does not need to be doped. The top surface 26 of the intermixed layer 24 is substantially planarized. Because the titanium layer provides good wetting of the Al layer, the dielectric layer or wafer temperature during deposition of PVD Al does not need to exceed the melting point of aluminum (660° C.), but rather may be performed at a temperature below about 660° C. and is preferable performed at a temperature below about 400° C.

Figure 3:
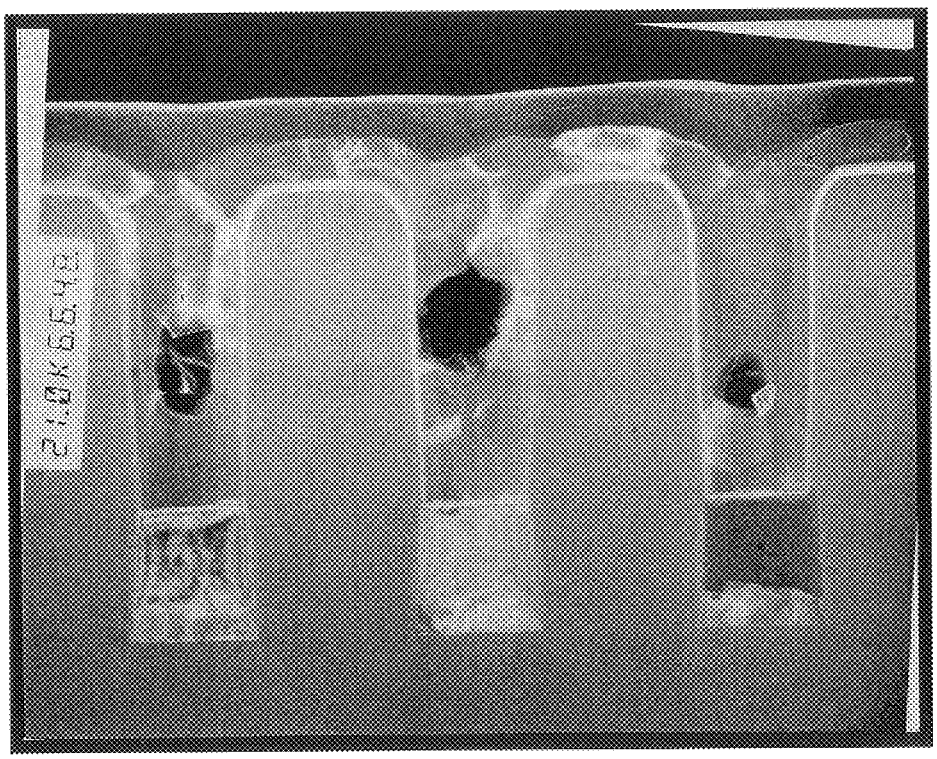
FIG. 3 is a transmission electron microscopy photograph showing a cross-section of semiconductor substrate vias having voids therein.

Referring now to FIG. 3, a transmission electron microscopy photograph showing a cross-section of semiconductor substrate vias having voids therein is shown. These voids are formed through a key hole mechanism common to CVD processes wherein the top or throat of the contact or via is sealed before the entire via can be filled. Although techniques for high aspect ratio sub-half micron metallization have previously been reported as achieving satisfactory electrical conduction, only through the use of improved transition electron microscopy techniques has it been shown that a bubble or void is present in the via plug. This void can be caused by reactant byproduct gas being trapped through a key hole mechanism or by the aluminum dewetting from the via walls. Through the forces of surface tension, gas will tend to form a single large spherical void having a small surface area within the contact or via structure.

Figure 4:
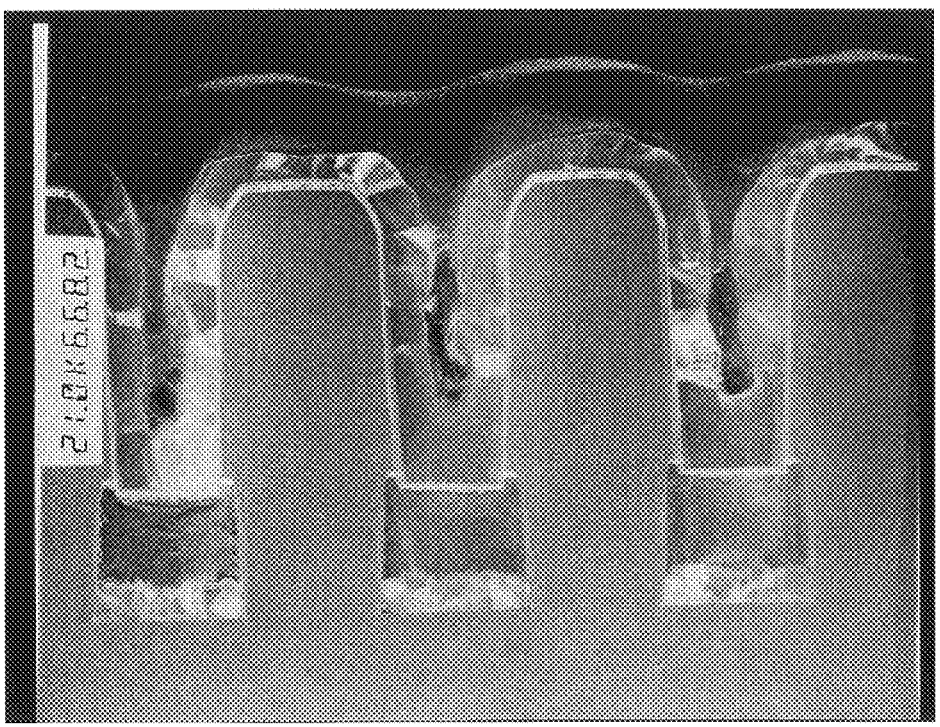
FIG. 4 is a transmission electron microscopy photograph showing a cross-section of semiconductor substrate vias having a thin titanium layer covered with a layer of CVD aluminum.

Referring now to FIG. 4, a transmission electron microscopy photograph showing a cross-section of semiconductor substrate vias having a thin titanium layer (about 600 Å) covered with a layer of CVD Al (about 1500 Å) is shown.

Figure 5:
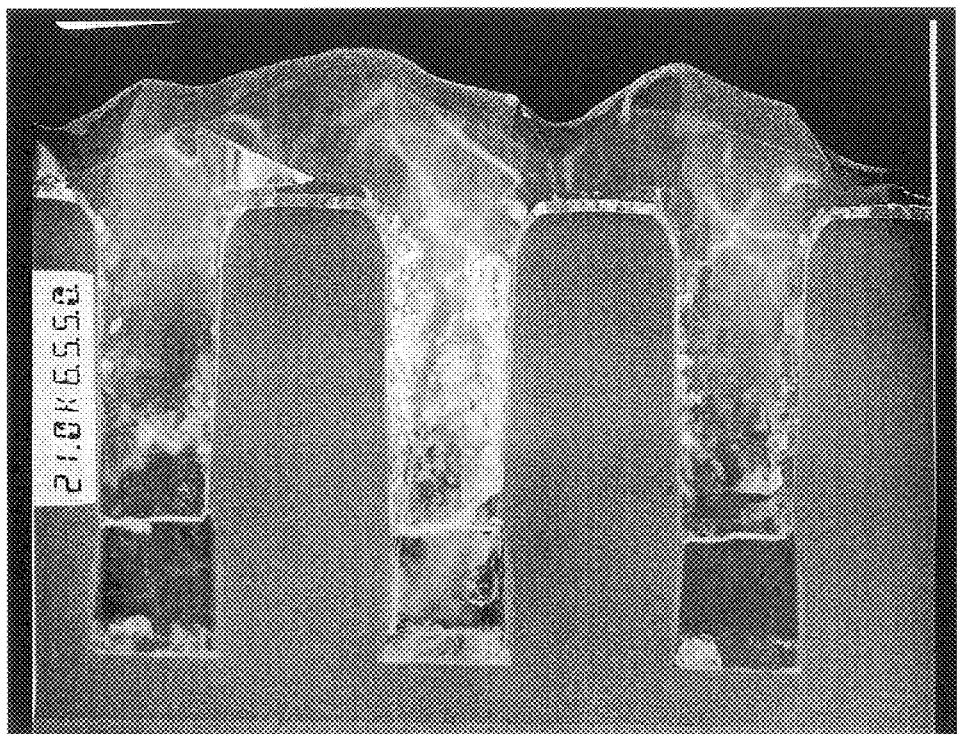
FIG. 5 is a transmission electron microscopy photograph showing a cross-section of semiconductor substrate vias having a completely filled via according to the present invention.

Referring now to FIG. 5, a transmission electron microscopy photograph showing a cross-section of semiconductor substrate vias having a completely filled via according to the present invention is shown. Note that the titanium glue layer remains a solid and does not flow or thin during deposition of either aluminum layer. The intermixed CVD/PVD Al layer shows large grain formation and is free of voids.

Figure 6:
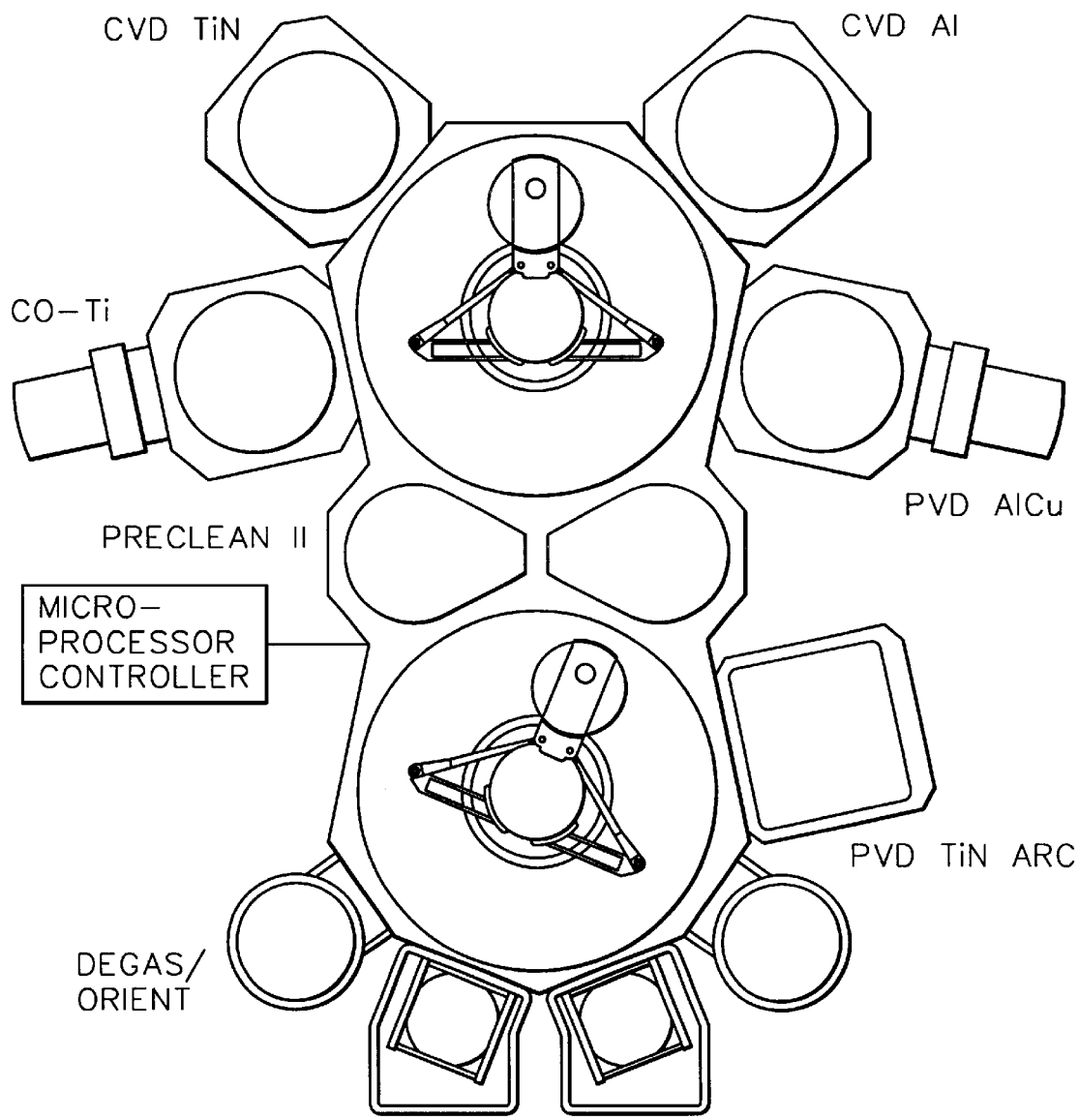
FIG. 6 is an integrated CVD/PVD system configured for sequential metallization in accordance with the present invention.

Referring now to FIG. 6, a schematic diagram of an integrated cluster tool is shown. A microprocessor controller is provided to control the sequence and formation of the desired film layers on the substrates. The cluster tool generally includes a de-gas chamber wherein the substrates are introduced to outgas contaminants. The substrate is then moved into a pre-clean chamber where the surface of the substrate is cleaned. Depending on the particular application, the substrate is moved by the robot into either a Coherent Ti chamber or a CVD TiN chamber. In the case where the substrate first receives deposition of a coherent Ti layer, the substrate is then typically processed in the CVD Ti chamber. Following deposition of the CVD Ti layer, the substrate is moved into a CVD Al chamber. Next, the substrate is processed in a PVD AlCu chamber. Finally, the substrate is introduced into a PVD TiN ARC chamber.

Improved Cu dispersion throughout the Al layer is achieved by the present invention because the integrated system allows the substrate to be processed continually in a single processing tool. This application prevents exposure of the processed substrate to the outside environment which may result in the formation of oxide layers on the first deposited, i.e., the CVD Al layer. Consequently, formation of an oxide layer onto the CVD Al layer inhibits even distribution of the Cu provided in the PVD Al process throughout the entire Al layer.

It should be appreciated that one of ordinary skill in the art would appreciate the structure and operation of the chambers shown in FIG. 6. Generally, the chambers typically include an enclosure, a substrate support member located within the enclosure and means for providing deposition material to be deposited on the substrates, and power means to provide an electrical bias within the chambers, i.e., the PVD chamber, to excite an inert gas such as Ar into a plasma state to sputter the target. The cluster tool also generally includes two robots for transferring the substrate through the processing steps required for the formation of film layers thereon.

One staged-vacuum wafer processing system is disclosed in U.S. Pat. No. 5,186,718, entitled Staged-Vacuum Wafer Processing System and Method, Tepman et al., issued on Feb. 16, 1993, which is hereby incorporated herein by reference.

Figure 7:
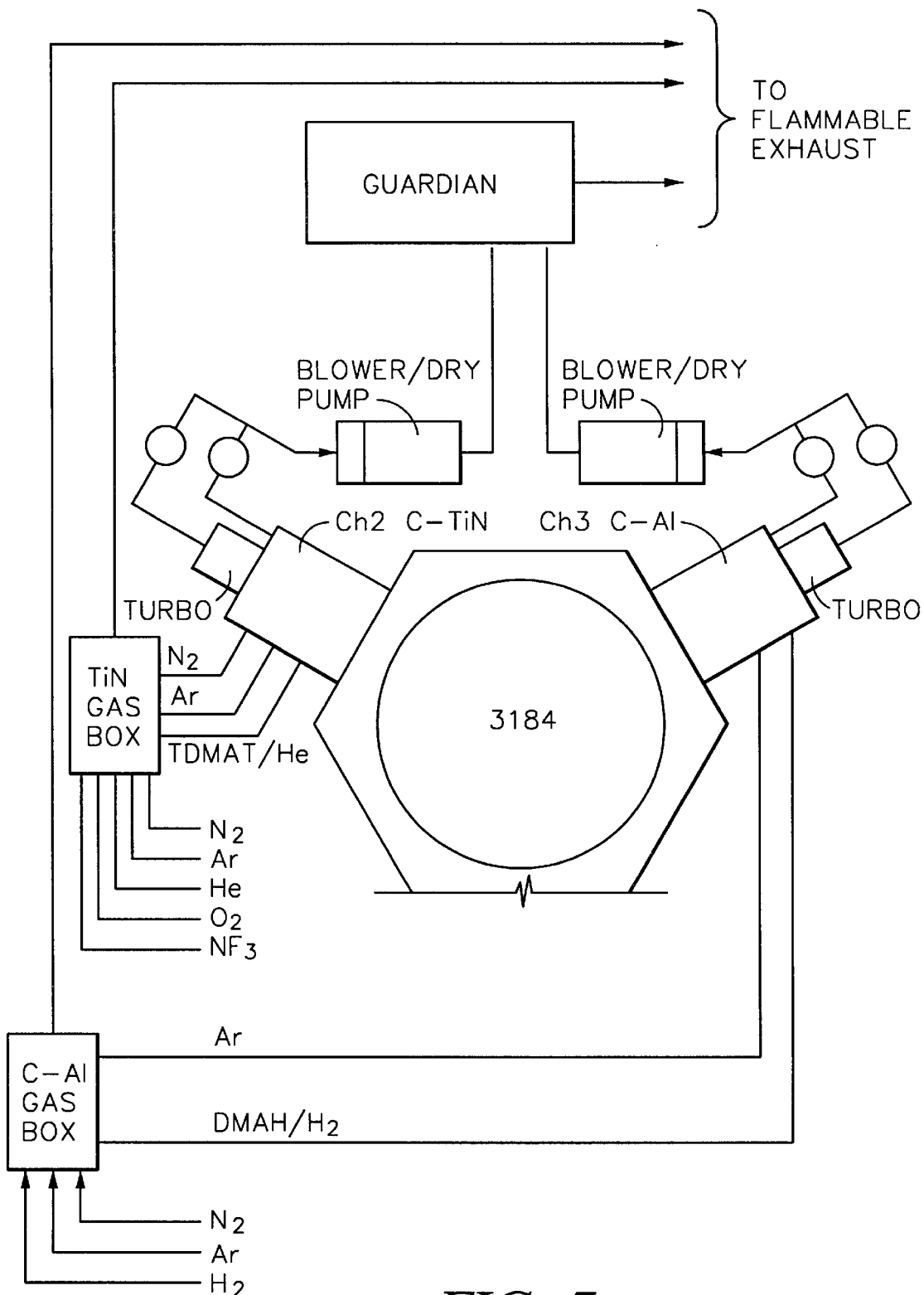
FIG. 7 is a schematic flow diagram of a CVD gas box delivery system for supplying gases to the system of FIG. 6.

Referring now to FIG. 7, a gas box system for supplying gases to the CVD chamber of the system in FIG. 6 is illustrated. The TiN gas box is supplied with $N_2$, Ar, He, $0_2$, and $NF_3$. The reaction product tetracus dimethyl amino titanium (TDMAT), along with the inert gas Ar and $N_2$, are passed into the CVD TiN chamber for processing. Similarly, a CVD Al gas box is supplied with $N_2$, Ar and $H_2$. The reaction product dimethyl aluminum hydride (DMAH)/$H_2$ and the inert gas Ar are passed into the CVD Al chamber for deposition of aluminum. Both chambers are equipped with a turbo pump for providing a vacuum in the chamber and a blower/dry pump.

While the foregoing is directed to the preferred embodiment of the present invention, other and further embodiments of the invention may be devised without departing from the basic scope thereof. The scope of the invention is determined by the claims which follow.

We claim:

1. A method of forming a feature on a substrate, comprising the steps of:
    a) sputtering a titanium layer over the surfaces of an aperture;
    b) chemical vapor depositing titanium nitride over the surface of the titanium layer, the titanium and titanium nitride layers having a thickness of between about 100 and about 200 Angstroms;
    c) depositing a metal over the titanium nitride.

2. The method of claim 1, wherein the metal deposited over the titanium nitride is aluminum and deposition of the aluminum occurs at a temperature below about 400° C.

3. The method of claim 1, wherein the steps a through c are performed sequentially in an integrated processing system.

4. The method of claim 2, wherein the deposited aluminum comprises a dopant, the method further comprising the step of annealing the deposited aluminum at a temperature of between about 250° C. and about 350° C.

5. A process for providing uniform step coverage on a substrate, comprising:
    a) forming a thin PVD titanium layer on a substrate in a chamber on a vacuum processing system;
    b) forming a thin conformal CVD titanium nitride layer over the PVD titanium layer in another chamber on the vacuum processing system, wherein the titanium and titanium nitride layers have a thickness of between about 100 and about 200 Angstroms;
    c) forming a metal layer over the CVD titanium nitride layer in one or more chambers on the vacuum processing system.

6. The process of claim 5 wherein the metal layer deposited on the titanium nitride has a thickness less than 1500 Angstroms.

7. The process of claim 5 wherein the metal layer deposited on the titanium nitride is deposited at a temperature less than 400° C.

8. A method of forming a feature on a substrate, comprising the steps of:
    a) sputtering a titanium layer over the surfaces of an aperture;
    b) chemical vapor depositing titanium nitride over the surface of the titanium layer, the titanium and titanium nitride layers having a thickness of between about 5 Angstroms and about 700 Angstroms;
    c) depositing a metal over the titanium nitride at a temperature below about 400° C.

9. The method of claim 8, wherein the combined titanium and titanium nitride layers have a thickness of between about 100 and about 200 Angstroms.

10. The method of claim 8, wherein the metal deposited over the titanium nitride is aluminum.

11. The method of claim 8, wherein the steps a through c are performed sequentially in an integrated processing system.

12. The method of claim 10, wherein the deposited aluminum comprises a dopant, the method further comprising the step of annealing the deposited aluminum at a temperature of between about 250° C. and about 350° C.

13. A process for providing uniform step coverage on a substrate, comprising:
    a) forming a thin PVD titanium layer on a substrate in a chamber on a vacuum processing system;
    b) forming a thin conformal CVD titanium nitride layer over the PVD titanium layer in another chamber on the vacuum processing system;
    c) forming a metal layer over the CVD titanium nitride layer in one or more chambers on the vacuum processing system, wherein the metal layer deposited on the titanium nitride is deposited at a temperature less than 400° C.

14. The process of claim 13 wherein the metal layer deposited on the titanium nitride has a thickness less than 1500 Angstroms.

15. The process of claim 14 wherein the titanium and titanium nitride layers have a combined thickness less than 600 Angstroms.

16. A process for providing uniform step coverage on a substrate, comprising:
    a) forming a thin PVD titanium layer on a substrate in a chamber on a vacuum processing system;
    b) forming a thin conformal CVD titanium nitride layer over the PVD titanium layer in another chamber on the vacuum processing system, wherein the titanium and titanium nitride layers have a thickness of between about 100 and about 200 Angstroms;
    c) forming a metal layer having a thickness less than 1500 Angstroms over the CVD titanium nitride layer in one or more chambers on the vacuum processing system.

* * * * *

UNITED STATES PATENT AND TRADEMARK OFFICE
CERTIFICATE OF CORRECTION

PATENT NO. : 6,355,560 B1  
DATED : March 12, 2002  
INVENTOR(S) : Roderick Craig Mosely et al.

It is certified that error appears in the above-identified patent and that said Letters Patent is hereby corrected as shown below:

<u>Title page,</u>  
Item [75], please change "Cupestino" to -- Cupertino --.  
Item [56], please add -- 437/192 -- at the end of patent 4,960,732  
Please add -- 427/126.1 -- at the end of patent 5,240,739.

<u>Column 1,</u>  
Line 33, please change "acommon" to -- a common --.  
Line 59, please change "filing" to -- filling --.

<u>Column 2,</u>  
Line 27, please change "typical" to -- typically --.

<u>Column 4,</u>  
Line 3, please change "th" to -- the --.

<u>Column 6,</u>  
Line 21, please change "preferable" to -- preferably --.

<u>Column 8,</u>  
Line 37, please delete the word "thin".  
Line 39, please delete the word "thin".

Signed and Sealed this

Twenty-ninth Day of October, 2002

*Attest:*

*Attesting Officer*

JAMES E. ROGAN  
*Director of the United States Patent and Trademark Office*